(12) United States Patent
Shi et al.

(10) Patent No.: US 11,271,131 B2
(45) Date of Patent: Mar. 8, 2022

(54) GROUP IV AND GROUP IV-VI SEMICONDUCTOR HETEROJUNCTION DEVICES

(71) Applicant: The Board of Regents of the University of Oklahoma, Norman, OK (US)

(72) Inventors: Zhisheng Shi, Norman, OK (US); Jijun Qiu, Norman, OK (US); Lance McDowell, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 16/992,855

(22) Filed: Aug. 13, 2020

(65) Prior Publication Data

US 2021/0050468 A1  Feb. 18, 2021

Related U.S. Application Data

(60) Provisional application No. 62/888,164, filed on Aug. 16, 2019.

(51) Int. Cl.
| | |
|---|---|
| *H01L 31/109* | (2006.01) |
| *H01L 31/18* | (2006.01) |
| *H01L 31/0336* | (2006.01) |
| *H01L 31/105* | (2006.01) |

(52) U.S. Cl.
CPC ........ *H01L 31/109* (2013.01); *H01L 31/0336* (2013.01); *H01L 31/105* (2013.01); *H01L 31/18* (2013.01)

(58) Field of Classification Search
CPC ... H01L 31/109; H01L 31/18; H01L 31/0336; H01L 31/105; H01L 31/0324; H01L 31/1013
See application file for complete search history.

(56) References Cited

U.S. PATENT DOCUMENTS

| | | | | |
|---|---|---|---|---|
| 4,677,289 A | * | 6/1987 | Nozaki | ..................... G01J 3/50 |
| | | | | 250/226 |
| 10,297,707 B1 | * | 5/2019 | Globus | ............... H01L 31/0324 |

(Continued)

OTHER PUBLICATIONS

Masumoto et al. "Fast electron transfer from PbSe quantum dots to TiO2" Appl. Phys. Lett. 100, 252106 (2012) (Year: 2012).*

(Continued)

*Primary Examiner* — Sitaramarao S Yechuri
(74) *Attorney, Agent, or Firm* — Conley Rose, P. C.; Grant Rodolph; Jonathan K. Polk

(57) ABSTRACT

A semiconductor PV detector comprises a Ge layer and a Pb-chalcogenide layer coupled to the Ge layer. The Ge layer comprises a first conduction band with a first conduction potential and a first valence band with a first valence potential. The Pb-chalcogenide layer comprises a second conduction band with a second conduction potential that is lower than the first conduction potential and a second valence band with a second valence potential that is lower than the first valence potential. The Ge layer and the Pb-chalcogenide layer form a heterojunction configured to allow electrons to flow from the Ge layer to the Pb-chalcogenide layer and allow holes to flow from the Pb-chalcogenide layer to the Ge layer.

25 Claims, 7 Drawing Sheets

(56) References Cited

U.S. PATENT DOCUMENTS

| | | | | |
|---|---|---|---|---|
| 2003/0184188 | A1* | 10/2003 | Kucherov | H01L 35/30 |
| | | | | 310/306 |
| 2007/0241260 | A1* | 10/2007 | Jaeger | H01L 31/1013 |
| | | | | 250/214.1 |
| 2014/0175591 | A1* | 6/2014 | Tian | H01L 31/036 |
| | | | | 257/440 |
| 2016/0111579 | A1* | 4/2016 | Shi | H01L 31/072 |
| | | | | 257/73 |
| 2017/0365721 | A1* | 12/2017 | Chi | H01L 29/66106 |
| 2018/0145109 | A1* | 5/2018 | Cao | H01L 27/14696 |
| 2019/0140129 | A1* | 5/2019 | Valouch | H01L 31/1013 |

OTHER PUBLICATIONS

Kenton Green, et al.; "Lead Salt TE-Cooled Imaging Sensor Development"; Proc. of SPIE; vol. 9070; 2014; 7 pages.

Jijun Qiu, et al.; "Study of Sensitization Process on Mid-Infrared Uncooled PbSe Photoconductive Detectors Leads to High Detectivity"; J. Appl. Phys.; vol. 113; 2013; 6 pages.

Binbin Weng, et al.; "CdS/PbSe Heterojunctions for High Temperature Mid-Infrared Photovoltaic Detector Applications"; Applied Physics Letters; vol. 104; 2014; 6 pages.

Binbin Weng, et al.; "Responsivity Enhancement of Mid-Infrared PbSe Detectors using CaF2 Nano-Structured Antireflective Coatings"; Applied Physics Letters; vol. 104; 2014; 5 pages.

Springholz, Gunther, et al.; "Molecular Beam Epitaxy of Narrowgap IV-VI Semiconductors"; Heteroepitaxy: Thin Film System; World Publishing; 1999; 68 pages.

\* cited by examiner

GROUP IV AND GROUP IV-VI SEMICONDUCTOR HETEROJUNCTION DEVICES

CROSS-REFERENCE TO RELATED APPLICATIONS

This claims priority to U.S. Prov. Patent App. No. 62/888,164 filed on Aug. 16, 2019, which is incorporated by reference.

STATEMENT REGARDING FEDERALLY SPONSORED RESEARCH OR DEVELOPMENT

This invention was made with government support under Contract Number W911NF18104418 awarded by the Army Research Office of the Department of Defense. The government has certain rights in the invention.

BACKGROUND

The commercial and dual-use (excluding military) worldwide market for infrared imaging equipment has been estimated at well over $2 billion per year. Military applications for infrared imaging are estimated at about $6 billion per year. There is a huge demand for a low-cost, uncooled camera with fast response time, especially for two-color SWIR-MWIR and multi-color SWIR-MWIR-LWIR cameras.

DETAILED DESCRIPTION

Figure 1:
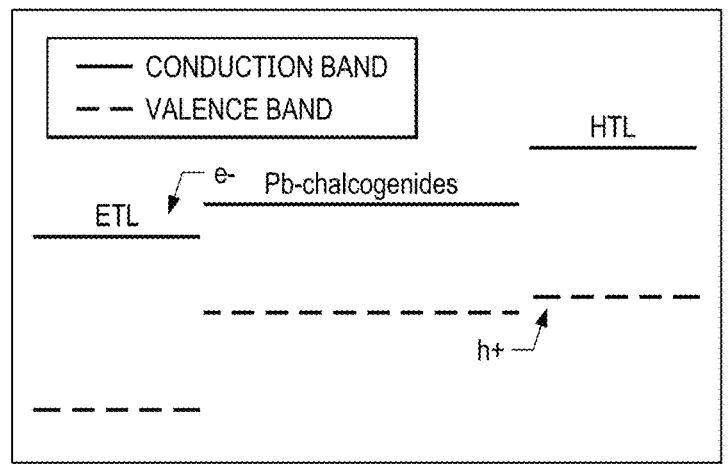
FIG. 1 is a schematic drawing of a bandgap alignment of a heterojunction of a group IV-VI Pb-chalcogenide semiconductor PV detector.

Infrared imaging systems currently in use are costly, large, and heavy, and they consume large amounts of power. For example, with the proliferation of small-sized UAVs, it is desirable to develop a sensor technology with costs that are in line with the overall cost of the vehicle. Currently, the only commercially-available, low-cost IR imagers are microbolometer arrays operating around a 9 μm wavelength. In addition, the third generation of IR detection modules is expected to provide new functionalities such as multi-color capability. Simultaneous imaging in multiple wavelength bands across the spectrum enables one to "see" details far beyond the capabilities of the human eye. Many electro-optic/infrared MSI systems for ISR applications combine at least one reflective-band/EO sensor with one thermal band/IR sensor. For night-vision imaging, it is desirable to have a multi-spectral system to provide a combination of SWIR (1.0-1.7 μm), MWIR (3.5-5.0 μm), and LWIR (8-12 μm) bands into a single system. Visible light, NIR, and SWIR are usually considered EO bands and form images using reflected light from a target. MWIR and LWIR are thermal IR bands, and they directly image blackbody radiation from a target.

Currently, the leading technologies for two-color MWIR/LWIR thermal imaging systems include MCT, QWIP, and antimonide SL detection modules. Monolithically-integrated SWIR EO sensors with MWIR/LWIR sensors are not available. Using separate FPAs for different bands in the MSI system often requires complicated optical systems that increase size and cost. Therefore, having monolithically-integrated SWIR, MWIR, or LWIR FPAs on the same chip is much desired. It is, however, very difficult to integrate the SWIR EO band into any of the above-mentioned leading MWIR/LWIR thermal imaging systems and maintain high performance due to a mismatch of dissimilar materials. Another challenge for the current leading material systems is a lack of a low-cost, large substrate. For example, a CdZnTe substrate for MCT is brittle and expensive. An Si or a Ge substrate is preferred because it is scalable, cheap, and environmentally friendly. In addition, cryogenic cooling is required for these sensors to have high performance, and that increases the SWaP.

In recent years, high-peak detectivity of $4.2 \times 10^{10}$ cm·$Hz^{1/2} \cdot W^{-1}$ and $2.8 \times 10^{10}$ cm·$Hz^{1/2} \cdot W^{-1}$ at room temperature with and without an anti-reflection layer were reported. TE-cooled 240×320 format arrays of PbSe photoconductor FPA monolithically fabricated on Si ROIC were also reported. These reports generated renewed interest in using a PbSe detector for high-temperature imaging applications in the mid-IR region.

To further improve the performance and overcome the drawbacks of the Pb-salt photoconductor such as high 1/f noise and poor pixel statistics due to poor surface morphology, a CdS/PbSe heterojunction detector on an Si substrate has been proposed. However, the conduction band of CdS may be higher than that of PbSe, which could block photo-generated carriers. For group IV-VI MWIR/LWIR semiconductors with bandgap, or energy gap, energies in the range of 0.1-0.3 eV, it is very challenging to find proper materials to form heterojunction structures for detectors. A heterojunction is an interface between two layers or regions of dissimilar semiconductors.

Disclosed herein are embodiments for group IV and group IV-VI semiconductor heterojunction devices. The devices include MWIR detectors and cameras. One non-limiting application is for two-color SWIR-MWIR and multi-color SWIR-MWIR-LWIR cameras, which operate at high temperatures and with fast response times. More particularly, the present disclosure pertains to a new heterojunction structure for group IV-VI Pb-chalcogenide semiconductor PV detector fabrication. Where used herein, the term "group IV" refers to the elements of IUPAC group IV (e.g., C, Si, Ge, Sn, and Pb); "group VI" refers to the elements of IUPAC group VI (e.g., S, Se, and Te); and "chalcogenide" refers to a chemical compound, including a sulfide, selenide, telluride, or polonide, that comprises a chalcogen anion and an electropositive element. For instance, the heterojunction structure is a PbSe/Ge heterojunction structure for an SWIR/MWIR two-color imaging application or an SWIR/MWIR/LWIR three-color multispectral imaging system. The system can operate at TE-cooled temperatures. Ge is a part of the heterojunction, which enables monolithic fabrication of a large-format FPA on a Ge or GeSi substrate. While a Pb-chalcogenide semiconductor is discussed, other semiconductor materials that provide MWIR detection, grow on group IV-VI materials such as Ge, and provide suitable band alignment with those group IV-VI materials may be used.

Before describing various embodiments of the present disclosure in more detail by way of exemplary description, examples, and results, it is to be understood as noted above that the present disclosure is not limited in application to the details of methods and apparatus as set forth in the following description. The present disclosure is capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the methods and apparatus of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used herein, all numerical values or ranges (e.g., in units of length such as micrometers or millimeters) include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example. For example, a reference to a range of 3 mm and 20 mm in diameter, or a range of 50 µm to 300 µm in thickness, is intended to explicitly include all units of measurement in the range.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the terms "about" and "approximately" are used to indicate that a value includes the inherent variation of error. Further, in this detailed description, each numerical value (e.g., temperature or time)

should be read once as modified by the term "about" (unless already expressly so modified), and then read again as not so modified unless otherwise indicated in context. As noted above, any range listed or described herein is intended to include, implicitly or explicitly, any number within the range, particularly all integers, including the end points, and is to be considered as having been so stated. For example, "a range from 1 to 10" is to be read as indicating each possible number, particularly integers, along the continuum between about 1 and about 10. Thus, even if specific data points within the range, or even no data points within the range, are explicitly identified or specifically referred to, it is to be understood that any data points within the range are to be considered to have been specified, and that the inventors possessed knowledge of the entire range and the points within the range. Unless otherwise stated, the terms "about" or "approximately", where used herein when referring to a measurable value such as an amount, length, thickness, a temporal duration, and the like, is meant to encompass, for example, variations of ±20% or ±10%, or ±5%, or ±1%, or ±0.1% from the specified value, as such variations are appropriate to perform the disclosed methods and as understood by persons having ordinary skill in the art.

As used herein, the term "substantially" means that the subsequently described parameter, event, or circumstance completely occurs or that the subsequently described parameter, event, or circumstance occurs to a great extent or degree. For example, the term "substantially" means that the subsequently described parameter, event, or circumstance occurs at least 90% of the time, or at least 91%, or at least 92%, or at least 93%, or at least 94%, or at least 95%, or at least 96%, or at least 97%, or at least 98%, or at least 99%, of the time, or means that the dimension or measurement is within at least 90%, or at least 91%, or at least 92%, or at least 93%, or at least 94%, or at least 95%, or at least 96%, or at least 97%, or at least 98%, or at least 99%, of the referenced dimension or measurement (e.g., length).

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The Following Abbreviations Apply:
A: ampere(s)
$BaF_2$: barium fluoride
C: carbon
CB: conduction band
Cd: cadmium
CdS: cadmium sulfide
CdZnTe: cadmium zinc telluride
cm: centimeter(s)
$E_f$: Fermi level
$E_g$: energy gap
EO: electro-optic
ETL: electron transport layer
Eu: europium
eV: electron-volt(s)
$e^-$: electron
FPA: focal plane array
Ge: germanium
GeSi: germanium silicide
HTL: hole transport layer
Hz: hertz
$h^+$: hole
IR: infrared
ISR: intelligence, surveillance, and reconnaissance
IUPAC: International Union of Pure and Applied Chemistry
J-V: current density-voltage
K: Kelvin
LWIR: long-wave IR
MBE: molecular-beam epitaxy
MCT: mercury cadmium telluride
MSI: multispectral imaging
MWIR: mid-wave IR
nm: nanometer(s)
NWIR: near-wave IR
Pb: lead
PbSe: lead selenide
PIN: p-type, intrinsic, n-type
PV: photovoltaic
QWIP: quantum well IR photodetector
RHEED: reflection high-energy electron diffraction
ROIC: read-out integrated circuitry
S: sulfur
Se: selenium
SEM: scanning electron microscope
Si: silicon
SL: superlattice
Sn: tin
Sr: strontium
SRH: Shockley-Read-Hall
SWaP: size, weight, and power
SWIR: short-wave IR
Te: tellurium
TE: thermoelectric
UAV: unmanned aerial vehicle
V: volt(s)
VB: valence band
W: watt(s)
μm: micrometer(s)
2D: two-dimensional
3D: three-dimensional.

FIG. 1 shows a schematic drawing of a group IV-VI Pb-chalcogenide semiconductor PV double-heterojunction detector structure 100. The left layer serves as an ETL, the middle layer is a group IV-VI Pb-chalcogenide semiconductor that serves as an MWIR absorption layer, and the right layer serves as an HTL. All three layers could absorb light at different wavelengths and form a three-color detector. Group IV-VI Pb-chalcogenide semiconductors could be p-type, n-type, or intrinsic. The ETL may be n doped to encourage electrons in the Pb-chalcogenide semiconductors to transport into the ETL, and the HTL may be p doped to encourage holes in the Pb-chalcogenide semiconductors to transport into the HTL. In such cases, an n-p junction will be formed between ETL and Pb-chalcogenide semiconductors, and a p-n junction will be formed between HTL and Pb-chalcogenide semiconductors. Also, in some embodiments, both the ETL and the HTL have wider bandgaps than that of the Pb-chalcogenide semiconductors. Either the ETL or the HTL could be replaced by ohmic contact material. In such cases, the double heterojunction becomes a single-heterojunction structure and a potential two-color detector structure.

For group IV-VI Pb-chalcogenide narrow-bandgap semiconductors in which the bandgap energy is typically in the range of 0.1 eV to 0.4 eV, it is challenging to find a proper ETL or HTL to form such heterojunctions. In the present disclosure, group IV semiconductors, such as Ge, are used as the HTL for group IV-VI Pb-chalcogenide semiconductors such as PbSe.

Figure 2A:
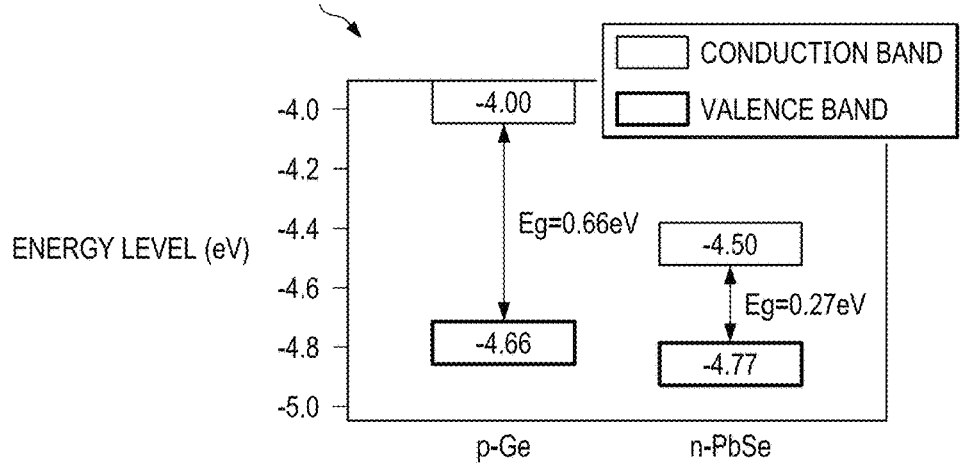
FIG. 2A is a schematic drawing of a bandgap alignment of PbSe/Ge.
Figure 2B:
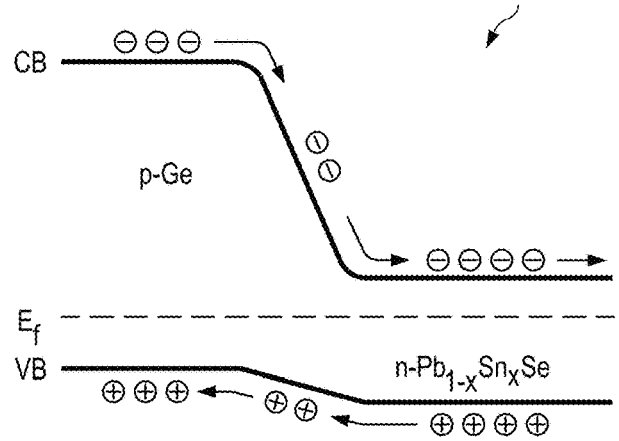
FIG. 2B is a schematic drawing of a carrier flow of a $Pb_{1-x}Sn_xSe/Ge$ heterojunction, where x is the Sn composition that ranges from 0 to about 0.35.

FIGS. 2A and 2B show a schematic drawing of an example group IV and group IV-VI Pb-chalcogenide semiconductor heterojunction. Specifically, in FIGS. 2A and 2B, the heterojunction is a Ge and Pb-chalcogenide heterojunction. The electron affinity of both Ge and PbSe is well studied, which ensures the required proper band alignment to fabricate heterojunction detectors. Specifically, as shown in a band alignment 200 in FIG. 2A, the conduction band of the Ge layer has a higher potential than the conduction band of the PbSe layer, and the valence band of the PbSe layer has a lower potential than the valence band of the Ge layer. Put another way, the conduction band of the PbSe layer is lower than the conduction band of the Ge layer, and the valence band of the Ge layer is higher than the valence band of the PbSe layer. As shown in a carrier flow 210 in FIG. 2B, this allows electrons to flow from the Ge layer to the PbSe layer and holes to flow from the PbSe layer to the Ge layer. In addition, the bandgap in the Ge layer provides for SWIR detection, and the bandgap of the PbSe layer provides for MWIR detection. Since large Ge substrates are commercially available, the most convenient approach is to grow a thin film $Pb_{1-x}Sn_xSe$ on a Ge substrate. The room temperature cut-off wavelength for PbSe is 4.6 μm. For Sn composition with x from 0 to about 0.35, the bandgap changes from 0.27 eV to zero, which covers the MWIR/LWIR range. Therefore $Pb_{1-x}Sn_xSe$ with a different Sn composition allows fabrication of an MWIR or LWIR detector.

FIGS. 3-8 show schematic drawings of non-limiting embodiments of structures of such heterojunction PV detectors. The group IV-VI Pb-chalcogenide semiconductors could be, for example, PbXSe, PbXTe, PbXS, where X represents a chemical element with a composition able to form ternary compound semiconductors. For example, X could be Sn, Sr, Eu, Cd, or Ge. The group IV-VI Pb-chalcogenide semiconductors could also have four or more elements such as $PbXSe_xTe_{1-x}$, $PbXSe_xS_{1-x}$, $PbXSe_xS_xTe_{1-x-y}$, where x and y are the composition. The group IV-VI Pb-chalcogenide semiconductors could be in mono-crystalline, polycrystalline, or amorphous form. The group lead salt materials could be in bulk form, micro-crystalline form, or nano-structure form such as quantum dot, quantum wire, or quantum well. They could be in 2D form or 3D form such as wires. The group IV semiconductor could be a single element such as Ge or multiple elements such as Ge on Si. It could be a group IV semiconductor alloy such as $Ge_xSn_ySi_{1-x-y}$. The group IV semiconductor could be also grown on any substrate such as glass, $BaF_2$, quartz, sapphire, or a conductive transparent oxide.

Figure 3:
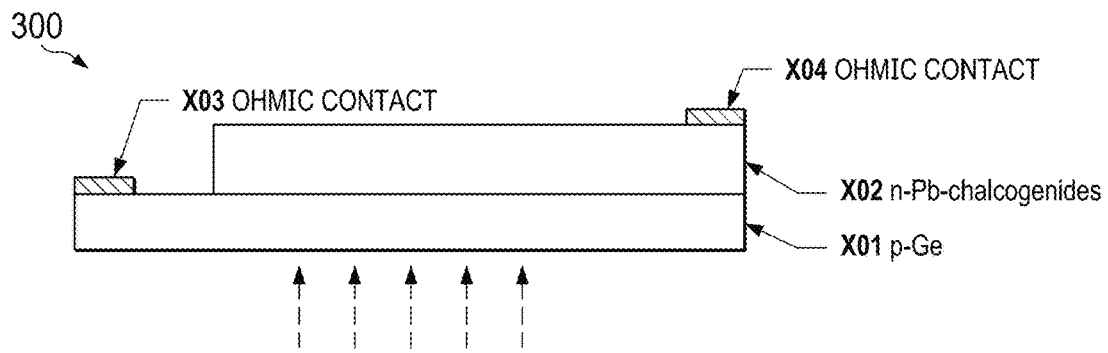
FIG. 3 is a schematic drawing of a group IV-VI Pb-chalcogenide semiconductor on a Ge heterojunction detector.

In a detector 300 in FIG. 3, the detection wavelength is mainly determined by the Pb-chalcogenides semiconductor. The Ge layer serves basically as a substrate. The Ge layer could also include Ge-based integrated circuitry.

Figure 4:
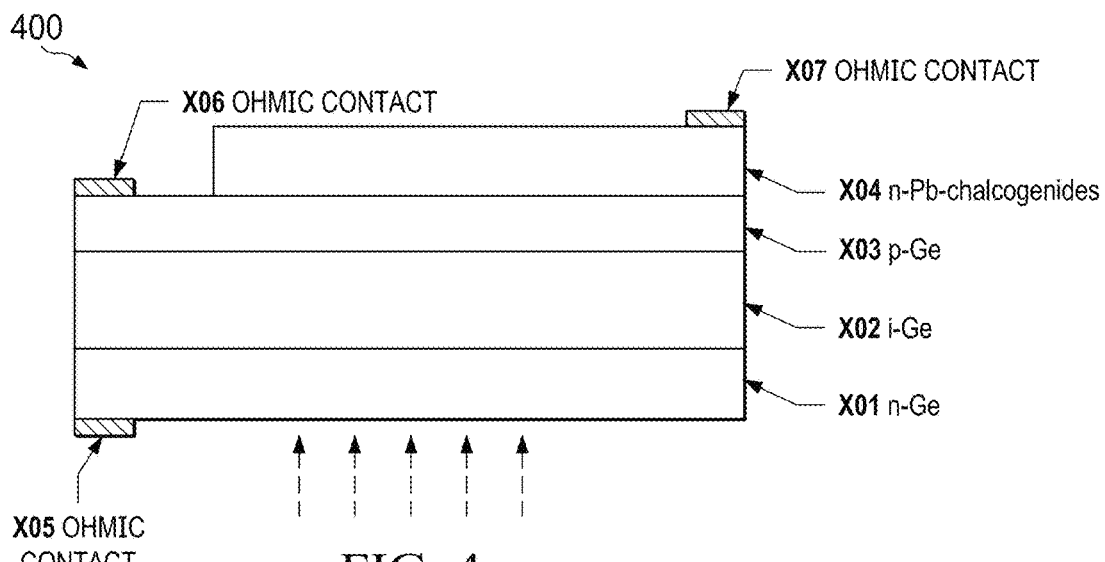
FIG. 4 is a schematic drawing of a group IV-VI Pb-chalcogenide semiconductor and a Ge heterojunction two-color detector.

In a detector 400 in FIG. 4, the Pb-chalcogenide semiconductor is grown on top of a Ge PIN detector. When contacts x05 and x06 are used to extract current, the structure serves as a Ge SWIR detector. When contacts x06 and x07 are used to extract current, the structure serves as a $Pb_{1-x}Sn_xSe$ MWIR or LWIR detector depending on x. When contacts x05 and x07 are used to extract current, the structure can simultaneously detect in the SWIR and MWIR/LWIR wavelength range. A three-color detector structure could also be made with the top $Pb_{1-x}Sn_xSe$ being a two-layer tandem structure, one in MWIR and another in LWIR.

Figure 5:
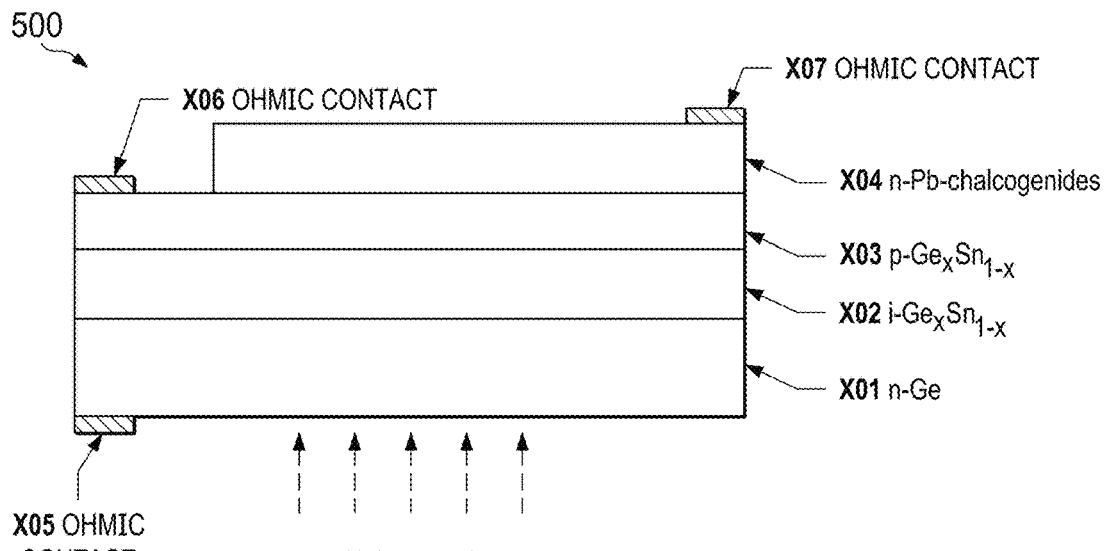
FIG. 5 is a schematic drawing of a group IV-VI Pb-chalcogenide semiconductor and a $Ge_xSn_{1-x}$ heterojunction two-color detector on a Ge substrate.

A detector 500 in FIG. 5 is a more general case of the structure shown in FIG. 4. In this structure, two layers of the Ge in FIG. 4 (x02 and x03) are replaced by $Ge_xSn_{1-x}$ alloys. The $Ge_xSn_{1-x}$ alloys have different material properties such as bandgap energy and lattice constant. For example, the detector cutoff wavelength will be tuned by the Sn composition in $Ge_xSn_{1-x}$ alloys.

Figure 6:
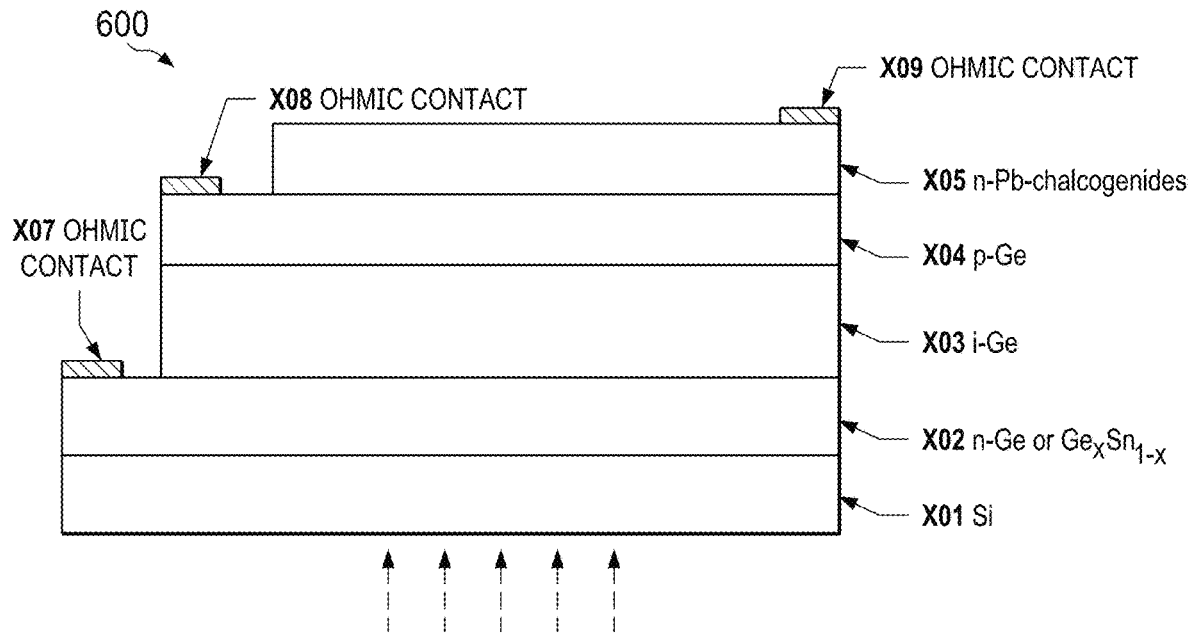
FIG. 6 is a schematic drawing of a group IV-VI Pb-chalcogenide semiconductor and Ge heterojunction two-color detector on an Si substrate.

In a detector 600 in FIG. 6, the two-color detector described in FIG. 4 is monolithically fabricated on the Si substrate. Layer x02 can be Ge, a $Ge_xSi_{1-x}$ alloy, or their graded layers. Ge on Si technology is well developed, and such wafers are commercially available. This allows monolithic integration of the two-color detector shown in FIG. 4 onto Si ROIC.

Figure 7:
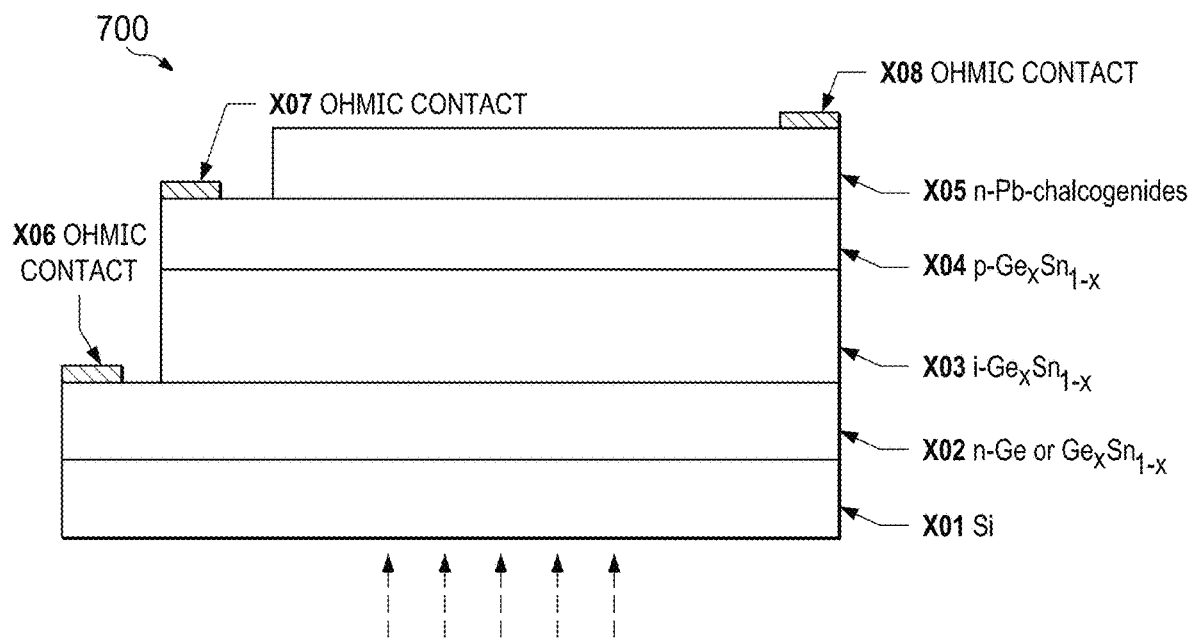
FIG. 7 is a schematic drawing of a group IV-VI Pb-chalcogenide semiconductor and $Ge_xSn_{1-x}$ heterojunction two-color detectors on an Si substrate.

A detector 700 in FIG. 7 is a more general case of the structure shown in FIG. 6. In this structure, two layers of Ge in FIG. 6 (x03 and x04) are replaced by $Ge_xSn_{1-x}$ alloys that have different material properties such as band structure and lattice constant. In this case, the two-color detector described in FIG. 5 is monolithically fabricated on the Si substrate. This allows monolithic integration of the two-color detector shown in FIG. 5 onto Si ROIC.

Figure 8:
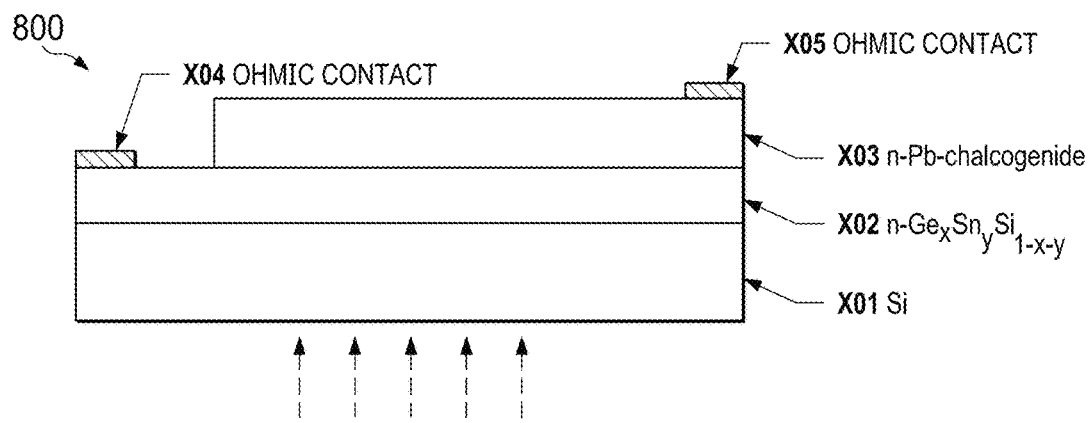
FIG. 8 is a schematic drawing of a group IV-VI Pb-chalcogenide semiconductor and a $Ge_xSn_ySi_{1-x-y}$ heterojunction detector on an Si substrate.

A detector 800 in FIG. 8 is a more general case of the structures shown in FIGS. 3-7. In this structure, group IV semiconductors are represented by $Ge_xSn_ySi_{1-x-y}$ alloys that can apply to all of the detector structure shown in FIGS. 3-7.

Additional embodiments may, for instance, improve material quality and thus junction characteristics. First, the mechanism of strain relaxation in group IV-VI materials is by glide of dislocations. The Burgers vectors are of type a/2<110> on the primary glide planes of {100}. For (100) oriented layers, the Schmid factors for glide in the primary {100} planes are zero, and no glide can occur in the main {100} glide system. Therefore, PbSe grown on [100] orientated dissimilar substrate often cracks due to the mismatch of lattice constant and thermal expansion coefficient. It has been proven that growth on non-(100) surface such as (111) surface could provide much higher material quality. (100) Ge substrate may be used because of the lower cost of (100) substrates. Second, post-growth treatment can be used to passivate defects in the PbSe and PbSe/Ge interface. For instance, iodine and oxygen may be used on PbSe. The passivation may reduce SRH recombination in a manner to similar to that for PbSe photodetectors.

Experimental Results

The key challenge for the structure was to grow high-quality PbSe on a Ge substrate. To demonstrate the concept, n-type PbSe was grown on a p-type Ge substrate in a water-cooled MBE system. A p-type Ge wafer was oriented with a mis-cut of 6° towards the nearest plane. After thermal treatment to remove a Ge oxide layer, PbSe was grown on the Ge substrate.

Figure 9A:
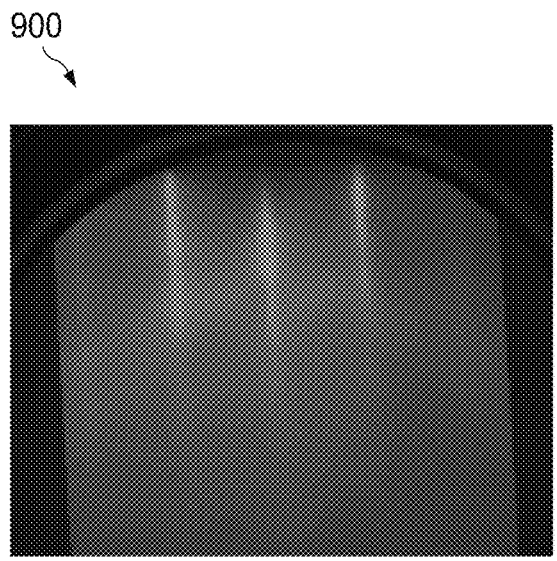
FIGS. 9A and 9B show the RHEED pattern of a 1 μm PbSe film grown on a Ge substrate.
Figure 9B:
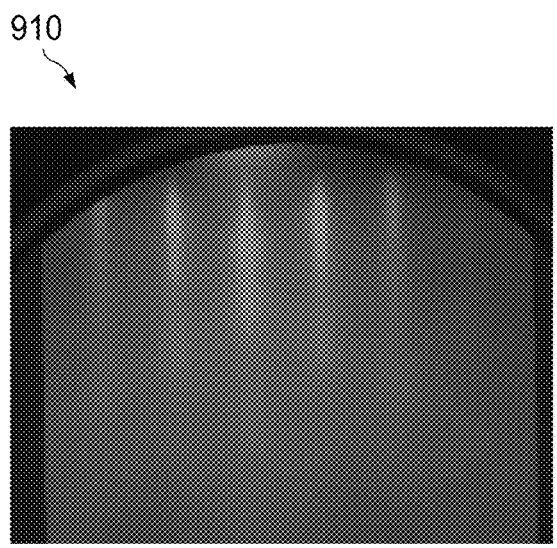

FIG. 9A shows the RHEED pattern 900 of PbSe grown on Ge (100) at the [100] azimuth after growth. FIG. 9B shows the RHEED pattern 910 of PbSe grown on Ge (100) at the azimuth after growth. The RHEED pattern shows that PbSe follows the substrate orientation and forms single crystalline films with layer-by-layer growth.

Figure 10A:
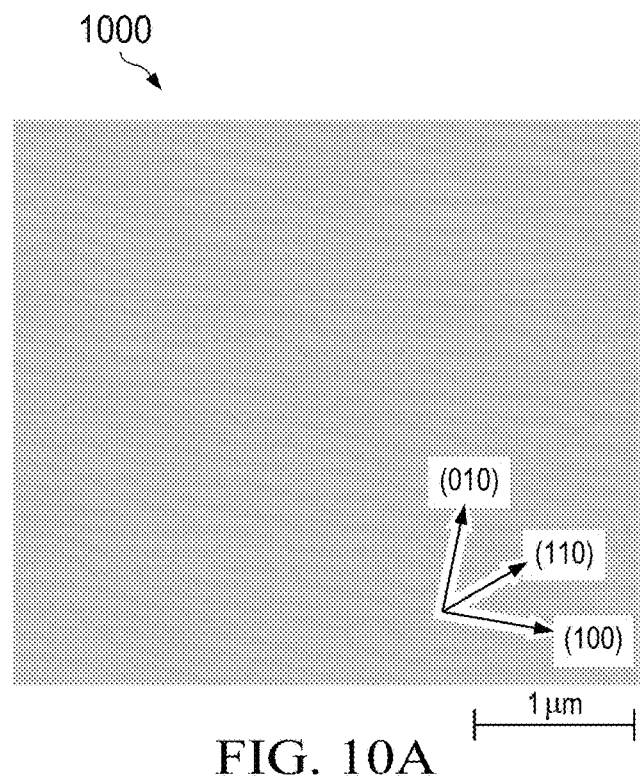
FIG. 10A shows a surface SEM image of PbSe grown on Ge.
Figure 10B:
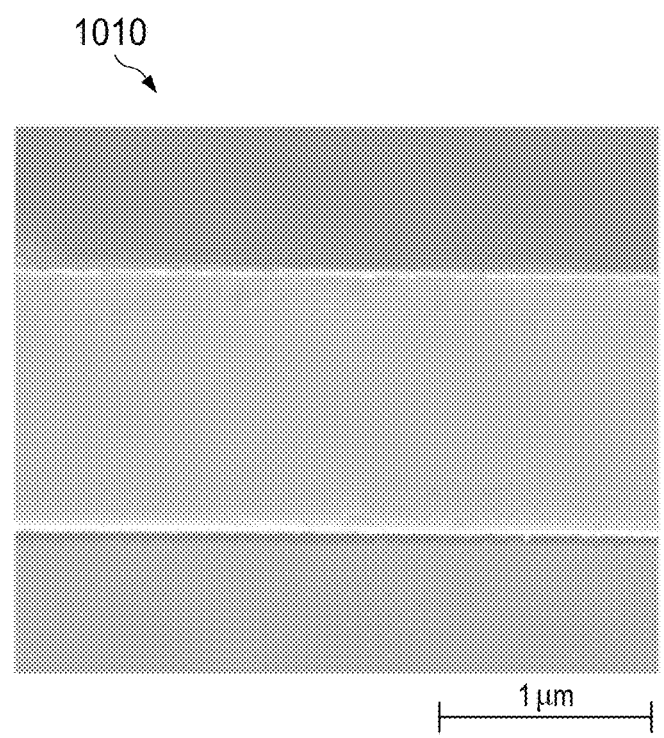
FIG. 10B shows cross-sectional SEM images of PbSe grown on Ge.

FIG. 10A shows a surface SEM image 1000 of PbSe grown on Ge (100). FIG. 10B shows cross-sectional SEM images 1010 of PbSe grown on Ge. The surface is crack-free with a very smooth surface. There are patterned surface ripples of about 10 nm in depth, which are most likely caused by the mismatch of lattices and therma expansion coefficients. The sample is etched into 120 μm×120 μm pixels.

Figure 11:
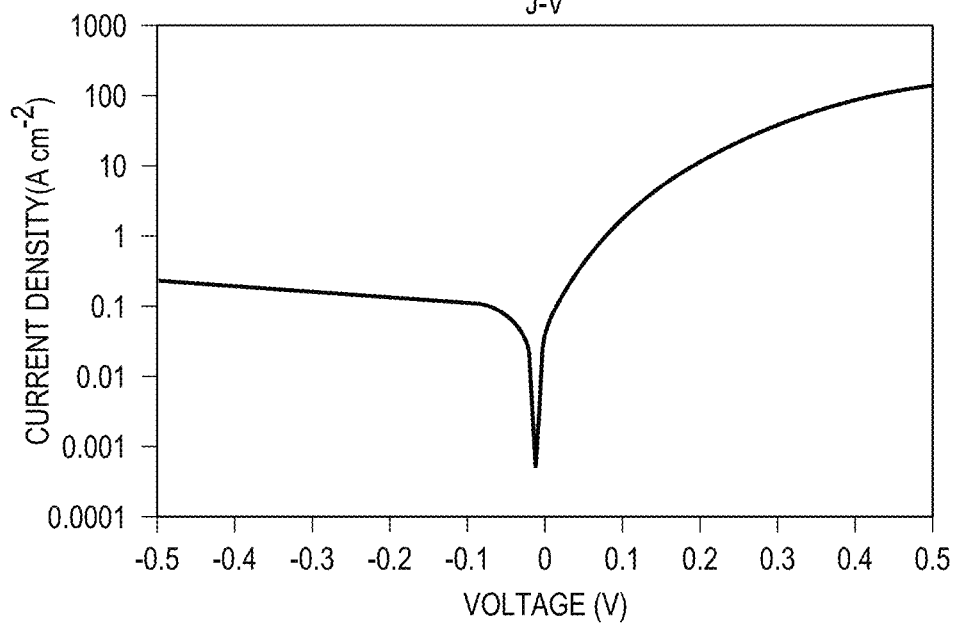
FIG. 11 is a room-temperature J-V curve of n-PbSe/p-Ge.

FIG. 11 is a room-temperature J-V curve 1100 of n-PbSe/p-Ge. The J-V curve was measured by a probe station. The J-V curve demonstrates a p-n junction diode characteristic with a rectifying factor of over 600 at room temperature.

Figure 12:
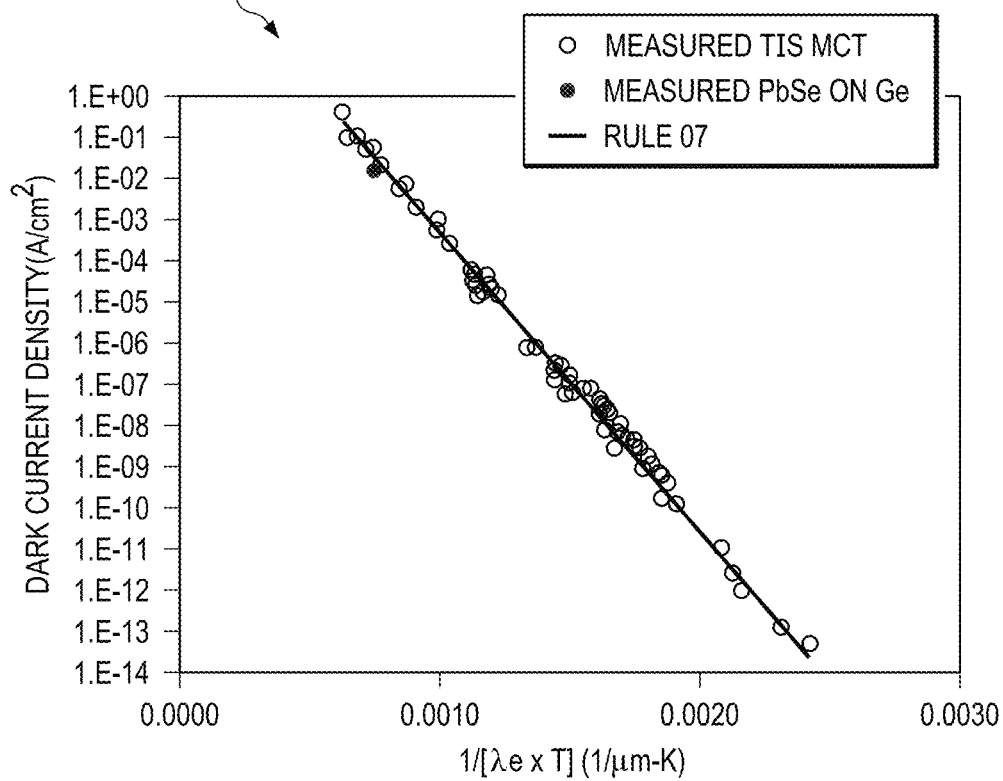
FIG. 12 shows PbSe/Ge current density compared to MCT rule 07.

FIG. 12 is a graph 1200 showing PbSe/Ge current density compared to MCT rule 07. With only limited development, the J-V curve of PbSe/Ge has exceeded the limits of the MCT detector.

Figure 13:
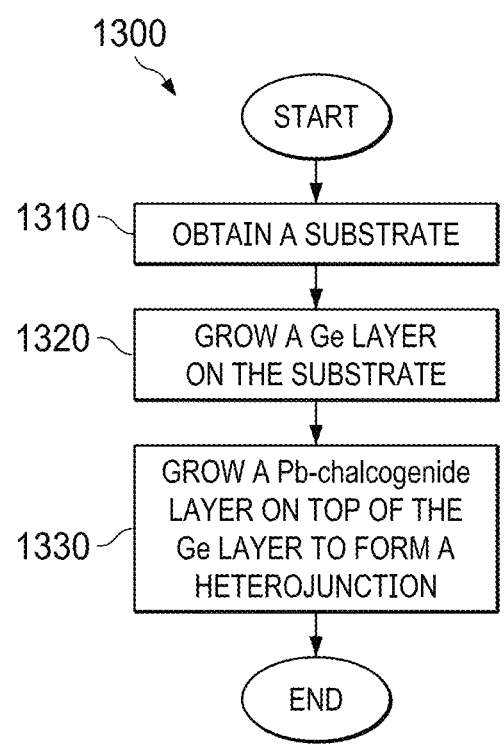
FIG. 13 is a flowchart illustrating a method of fabricating a semiconductor PV detector.

FIG. 13 is a flowchart illustrating a method 1300 of fabricating a semiconductor PV detector. At step 1310, a substrate is obtained. For instance, the substrate is an Si substrate. At step 1320, a Ge layer is grown on the substrate. The Ge layer comprises a first conduction band with a first conduction potential and a first valence band with a first valence potential. Finally, at step 1330, a Pb-chalcogenide layer is grown on top of the Ge layer to form a heterojunction. The Pb-chalcogenide layer comprises a second conduction band and a second valence band. The second conduction band has a second conduction potential that is lower than the first conduction potential. The second valence band has a second valence potential that is lower than the second valence potential. The heterojunction is configured to allow electrons to flow from the Ge layer to the Pb-chalcogenide layer and allow holes to flow from the Pb-chalcogenide layer to the Ge layer. A substrate or layer defined by a material, for instance Ge, is a layer in which that material is the primary material. For instance, the Ge layer primarily comprises Ge, but may further comprise other materials such as Sn or Si.

The embodiments have several advantages over other approaches. First, Ge SWIR detectors are a mature technology and are commercially available, so Ge and Pb-chalcogenide semiconductors can be monolithically integrated on a Ge/Si substrate and naturally form a two-color SWIR-MWIR PV detector. Second, large, cost-effective Ge substrates are commercially available, which enables fabrication of low-cost, large-format detector FPAs, which lead to low-cost SWIR-MWIR two-color cameras. Third, the group IV semiconductor (e.g., Ge) is not only used as a substrate, but is additionally an important functional semiconductor as an HTL and an SWIR absorber in the two-color detector. Fourth, the PbSe PV detector overcomes drawbacks of other photoconductors, namely large 1/f noise and inhomogeneity.

What is claimed is:

1. A semiconductor photovoltaic (PV) detector comprising:
a germanium (Ge) layer comprising:
a first conduction band with a first conduction potential, and
a first valence band with a first valence potential; and
a lead-chalcogenide (Pb-chalcogenide) layer grown on top of the Ge layer and comprising:
a second conduction band with a second conduction potential that is lower than the first conduction potential, and
a second valence band with a second valence potential that is lower than the first valence potential,
wherein the Ge layer and the Pb-chalcogenide layer form a heterojunction configured to:
allow electrons to flow from the Ge layer to the Pb-chalcogenide layer, and
allow holes to flow from the Pb-chalcogenide layer to the Ge layer.

2. The semiconductor PV detector of claim 1, wherein the Ge layer has a bandgap of about 0.66 electron-volts (eV).

3. The semiconductor PV detector of claim 1, wherein the Pb-chalcogenide layer has a bandgap of about 0.27 electron-volts (eV).

4. The semiconductor PV detector of claim 1, wherein the Pb-chalcogenide layer is configured to detect a first color in a mid-wave infrared (MWIR) range.

5. The semiconductor PV detector of claim 4, wherein the Ge layer is configured to detect a second color in a short-wave infrared (SWIR) range.

6. The semiconductor PV detector of claim 1, further comprising a first ohmic contact coupled to the Pb-chalcogenide layer.

7. The semiconductor PV detector of claim 6, further comprising a second ohmic contact coupled to the Ge layer.

8. The semiconductor PV detector of claim 1, wherein the Ge layer comprises:
a p-type layer coupled to the Pb-chalcogenide layer;
an intrinsic layer coupled to the p-type layer; and
an n-type layer coupled to the intrinsic layer.

9. The semiconductor PV detector of claim 8, wherein the p-type layer comprises tin (Sn).

10. The semiconductor PV detector of claim 9, wherein the intrinsic layer comprises Sn.

11. The semiconductor PV detector of claim 10, wherein the Pb-chalcogenide layer comprises selenium (Se), tellurium (Te), sulfur (S), Sn, strontium (Sr), europium (Eu), cadmium (Cd), or Ge.

12. The semiconductor PV detector of claim 11, further comprising a silicon (Si) substrate coupled to the n-type layer.

13. The semiconductor PV detector of claim 12, wherein the n-type layer comprises germanium silicide (GeSi).

14. The semiconductor PV detector of claim 8, further comprising a silicon (Si) substrate coupled to the n-type layer.

15. The semiconductor PV detector of claim 14, wherein the n-type layer comprises germanium silicide (GeSi).

16. The semiconductor PV detector of claim 1, wherein the semiconductor PV detector is a camera.

17. The semiconductor PV detector of claim 1, further comprising a substrate, wherein the Ge layer and the Pb-chalcogenide layer are monolithically integrated on the substrate.

18. The semiconductor PV detector of claim 17, wherein the substrate comprises silicon (Si) or Ge.

19. A semiconductor photovoltaic (PV) detector comprising:
a germanium (Ge) layer comprising:
a first conduction band with a first conduction potential, and
a first valence band with a first valence potential,
wherein the Ge layer further comprises tin (Sn); and
a lead-chalcogenide (Pb-chalcogenide) layer coupled to the Ge layer and comprising:
a second conduction band with a second conduction potential that is lower than the first conduction potential, and
a second valence band with a second valence potential that is lower than the first valence potential,
wherein the Ge layer and the Pb-chalcogenide layer form a heterojunction configured to:

allow electrons to flow from the Ge layer to the Pb-chalcogenide layer, and allow holes to flow from the Pb-chalcogenide layer to the Ge layer.

20. The semiconductor PV detector of claim 19, wherein the Ge layer further comprises silicon (Si).

21. The semiconductor PV detector of claim 20, further comprising an Si substrate coupled to the Ge layer.

22. A method of fabricating a semiconductor PV detector and comprising:

obtaining a substrate;

growing a germanium (Ge) layer on the substrate, wherein the Ge layer comprises a first conduction band with a first conduction potential and a first valence band with a first valence potential; and growing a lead-chalcogenide (Pb-chalcogenide) layer on top of the Ge layer to form a heterojunction, wherein the Pb-chalcogenide layer comprises a second conduction band and a second valence band, wherein the second conduction band has a second conduction potential that is lower than the first conduction potential, wherein the second valence band has a second valence potential that is lower than the first valence potential, and wherein the heterojunction is configured to allow electrons to flow from the Ge layer to the Pb-chalcogenide layer and allow holes to flow from the Pb-chalcogenide layer to the Ge layer.

23. The method of claim 22, further comprising monolithically fabricating the Ge layer and the Pb-chalcogenide layer on the substrate.

24. The method of claim 23, wherein the substrate comprises silicon (Si) or Ge.

25. The method of claim 23, wherein the Ge layer comprises tin (Sn).

* * * * *